United States Patent
Melody et al.

(10) Patent No.: US 6,798,645 B2
(45) Date of Patent: Sep. 28, 2004

(54) PROTECTING RESIN-ENCAPSULATED COMPONENTS

(75) Inventors: Brian John Melody, Greer, SC (US); John Tony Kinard, Greer, SC (US); Daniel F. Persico, Simpsonville, SC (US); Chris Stolarski, Greenville, SC (US); Phillip Michael Lessner, Simpsonville, SC (US); Qingping Chen, Simpsonville, SC (US); Kim Pritchard, Mauldin, SC (US); Albert Kennedy Harrington, Fountain Inn, SC (US); David Alexander Wheeler, Williamston, SC (US)

(73) Assignee: Kemet Electronics Corp., Greenville, SC (US)

(*) Notice: Subject to any disclaimer, the term of this patent is extended or adjusted under 35 U.S.C. 154(b) by 0 days.

(21) Appl. No.: 10/759,311

(22) Filed: Jan. 16, 2004

(65) Prior Publication Data

US 2004/0156165 A1 Aug. 12, 2004

Related U.S. Application Data

(62) Division of application No. 10/365,209, filed on Feb. 12, 2003.

(51) Int. Cl.[7] .................. H01G 4/228; H01G 9/10; H01G 5/03

(52) U.S. Cl. .................. 361/538; 361/540; 361/533

(58) Field of Search .................. 361/532–540

(56) References Cited

U.S. PATENT DOCUMENTS

| 6,229,687 B1 | 5/2001 | Wada et al. ............ 361/523 |
| 6,324,051 B1 | 11/2001 | Igaki et al. ............ 361/523 |
| 6,370,016 B1 | 4/2002 | Stevens ............ 361/519 |

FOREIGN PATENT DOCUMENTS

| JP | 5-291087 | * 11/1993 | ............ H01G/9/05 |

* cited by examiner

Primary Examiner—Dean A. Reichard
Assistant Examiner—Eric Thomas
(74) Attorney, Agent, or Firm—Joseph T. Guy; Nexsen Pruet LLC

(57) ABSTRACT

A method of protecting surface mount capacitors from moisture and oxygen corrosion by applying a thermally curable pre-coat resin to a portion of the terminals of a capacitor and encapsulating the element(s) with a protective resin. The pre-coat resin is substantially rigid at ambient temperatures and flexible at elevated temperatures and is preferably a lactone-containing epoxy resin. The pre-coat resin may be applied to a solder coating-free portion of the terminals by brush or wiper prior to encapsulating the capacitor element(s) with the protective resin.

4 Claims, 2 Drawing Sheets

PROTECTING RESIN-ENCAPSULATED COMPONENTS

RELATED APPLICATIONS

This application is a divisional application of U.S. patent application Ser. No. 10/365,209 filed Feb. 12, 2003 which is pending.

FIELD OF THE INVENTION

This invention relates to protecting surface mount components from ambient environment, and more particularly to protecting resin-encapsulated capacitors from ambient moisture/oxygen.

BACKGROUND OF THE INVENTION

With an ever increasing number of applications for electronics, surface mount technology has been used more frequently to construct electronic circuits. In surface mount technology, electronic components typically take the form of chip components having terminals for attachment by soldering to electronic boards. The terminals of the chip components require good solderability while also having heat resistance to withstand high temperatures during soldering and/or operation of the components.

Surface mount capacitors are generally protected from destructive effects of moisture and oxygen found in ambient environment by employing a seal formed by adhesion of a molding resin to a portion of a lead frame for the capacitor. As examples of conventional surface mount capacitors, FIG 1A shows a cross-sectional view of a first known surface mountable solid electrolytic capacitor, shown generally at 20, and FIG. 1B shows a cross-sectional view of a second known surface mountable solid electrolytic capacitor 30. The known capacitors 20, 30 are formed by molding an interior capacitor element, shown generally at 22, together with lead frames 24 that eventually serve as terminals, with an encapsulating resin 26. In accordance with the first known capacitor 20, the capacitor element is connected to the lead frame 24 by welding an anode stack, shown generally at 21, to an anode terminal 23 and adhering a cathode-coated anode coupon, shown generally at 25, to a cathode terminal 27 using silver loaded adhesive 29, for example. The welding is accomplished using resistance or laser welding. In accordance with the second known capacitor 30, one portion of the lead frame 24 is connected to a capacitor anode riser wire 32, and another portion of the lead frame 24 is connected to a capacitor cathode-coated anode body 34. The capacitor element is coated with a conductive silver paint 36 prior to attaching the lead frame 24 to the cathode-coated anode 34. Unfortunately, oxygen and moisture from the ambient environment may access the interior capacitor element 22 underneath the encapsulating resin 26 to degrade performance of conventional capacitors 20, 30. The oxygen and moisture access commonly occurs following surface mounting of the chip capacitor because of gaps created between the encapsulating resin and the lead frame from heat applied during surface mounting. Alternatively, such gaps may be created during operation of the conventional capacitors 20, 30.

U.S. Pat. No. 6,229,687 (the '687 Patent) proposes a method of preventing environment moisture and oxygen from accessing the capacitor element underneath the encapsulated resin. The '687 Patent describes a solid electrolytic capacitor having an element that is prepared by forming an oxide layer, a conductive high polymer layer, and a conductor layer in succession on a valve metal. Lead frames of a selected metal are electrically connected to the valve metal and conductor layer, and a protective resin encapsulates the capacitor element and part of the lead frames. The surface of the lead frames contacting the protective resin has a roughened copper layer, and the protective resin has a thermal expansion coefficient that is close to the thermal expansion coefficient of the metal of the lead frames. The copper layer requires additional process steps and associated costs for forming the copper layer and sand blasting the layer for correct roughness.

A need exists for a method of preventing environment moisture and oxygen from accessing interior elements of surface mount components having resin encapsulation. More particularly, a need exists for a method of protecting resin-encapsulated capacitors from moisture and oxygen degradation of capacitor elements underneath the resin encapsulation that is relatively simple and inexpensive.

SUMMARY OF THE INVENTION

An object of this invention is to provide a method of protecting resin-encapsulated capacitors from moisture and oxygen degradation of capacitor elements encompassed by the resin encapsulation.

A more particular object of this invention is to provide a method of protecting resin-encapsulated capacitors from moisture and oxygen degradation of capacitor elements that is relatively simple and inexpensive to implement.

Another object of this invention to provide a method of preventing environment moisture and oxygen from accessing interior elements of surface mount components having resin encapsulation during mounting and operation of the components Another object of this invention is to provide a resin-encapsulated solid electrolytic capacitor having a pre-coat resin applied to a portion of the terminals of the capacitor prior to resin encapsulation that prevents ambient moisture and oxygen from degrading the capacitor elements.

Another object of the invention is to provide a method of manufacturing a resin-encapsulated solid electrolytic capacitor having a pre-coat resin applied to a portion of the terminals of the capacitor prior to resin encapsulation that prevents ambient moisture and oxygen from degrading the capacitor elements.

These and other objects of the invention are accomplished by providing a method of protecting resin-encapsulated capacitors from moisture and oxygen degradation of capacitor elements encompassed by the resin encapsulation. The method includes applying a thermally curable pre-coat resin to a portion of the capacitor terminals and subsequently encapsulating the capacitor element with a protective resin. The pre-coat resin has the characteristics of being substantially rigid at ambient temperatures and flexible at elevated temperatures so that separation of the encapsulating resin from the terminals is prevented. The pre-coat resin is preferably a thermally curable epoxy resin, and more preferably a thermally curable lactone-containing epoxy resin mixture. During manufacture of the capacitor, the pre-coat resin is applied to solder coating-free portions of the capacitor terminals by wiping, spraying, or brushing the pre-coat resin onto the terminal portions.

Additionally, these and other objects of the invention are accomplished by providing a solid electrolytic capacitor having a solid electrolytic capacitor element connected to surface mount terminals, a pre-coat resin applied to a portion of the terminals, and a protective resin encapsulating the capacitor element and applied to a portion of the terminals over the pre-coat resin.

DETAILED DESCRIPTION OF THE INVENTION

Figure 1A:
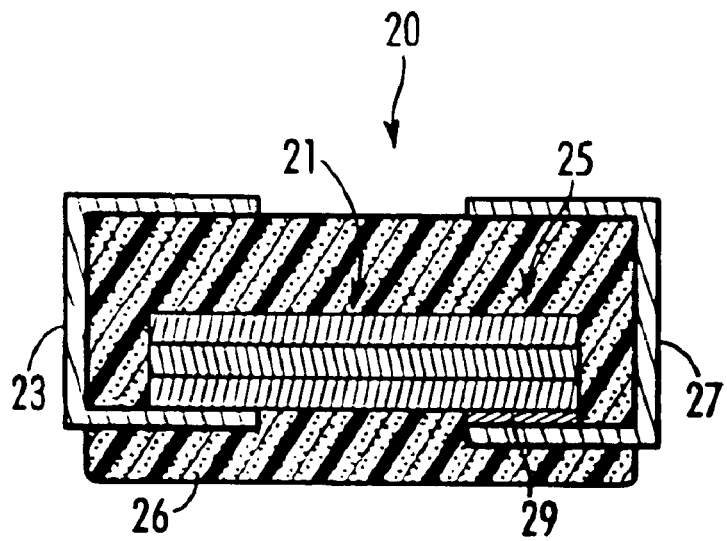
FIG. 1A is a cross-sectional view of a first known resin-encapsulated solid electrolytic capacitor.
Figure 1B:
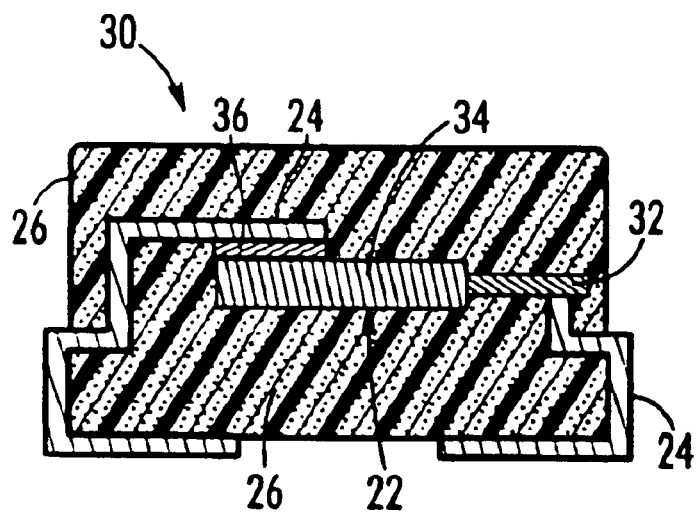
FIG 1B is a cross-sectional view of a second known resin-encapsulated solid electrolytic capacitor.

The present invention is a method of protecting resin-encapsulated capacitors from moisture and oxygen degradation of capacitor elements encompassed by the resin encapsulation. The capacitor element is connected to terminals for surface mounting. The method includes applying a thermally curable pre-coat-resin to a portion of the capacitor terminals and subsequently encapsulating the capacitor element with a protective resin. The method uses the pre-coat resin to prevent separation of the resin encapsulation from the terminals. Additionally, the pre-coat resin prevents moisture and oxygen found in the ambient environment from accessing the capacitor element underneath the resin encapsulation. The present invention is also a resin-encapsulated solid electrolytic capacitor having a pre-coat resin covering a portion of the capacitor terminals between the capacitor element and the protective resin.

The capacitor element is formed according to conventional methods. For example, a valve metal foil is anodized in an aqueous electrolytic solution wherein the electrolytic solution is subjected to an anodizing voltage. The anodized foil is then cut into coupons of appropriate size, and then the coupons are welded to process bars. The edges of the coupons are preferably anodized in an electrolytic solution to coat the cut edges with anodic oxide. Alternatively, the metal foil is punched to form a comb-shaped electrode having projections, or coupons, and then anodized in the electrolytic solution. The coupons are then coated with a conductive polymer, such as by electrolytic polymerization, and preferably further coated with graphite and silver paint prior to assembly into finished capacitors. Each of the coupons is then cut to form a capacitor element. The capacitor element is attached to a lead frame, which subsequently forms the capacitor terminals, using conductive adhesive for cathode terminal attachment and/or laser welding or resistance welding for anode terminal attachment. The location of the lead frame with respect to the capacitor element depends on a desired anode or cathode attachment relative to the lead frame.

Although the invented capacitor is described with respect to a capacitor element based on a single valve metal coupon, the capacitor element may be also be formed with multiple coupons laminated together in accordance with conventional laminated capacitor techniques.

During manufacture of the invented capacitor, the pre-coat resin is applied to solder coating-free portions of the capacitor terminals by wiping, spraying, or brushing the pre-coat resin onto the terminal portions prior to encasing the capacitor element with the protective resin. The pre-coat resin has the characteristics of being substantially rigid at ambient temperatures and flexible at elevated temperatures so that separation of the encapsulating resin from the terminals is prevented. The pre-coat resin is preferably a thermally curable epoxy resin, and more preferably a thermally curable lactone-containing, such as butyrolactone, epoxy resin mixture.

Figure 2A:
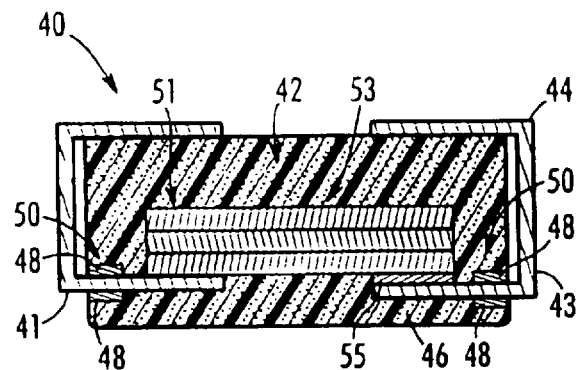
FIG. 2A is a cross-sectional view of a solid electrolytic capacitor in accordance with a first embodiment of the present invention.

FIG. 2A is a cross-sectional view of a resin-encapsulated solid electrolytic capacitor, shown generally at 40, in accordance a first embodiment with the present invention. As previously mentioned, the capacitor element, shown generally at 42, is attached to the lead frame 44 by conventional methods, and a portion of the lead frame 44 serves as the capacitor terminals 41, 43. The capacitor 40 includes the pre-coat resin 48 that covers a solder coating-free portion, shown generally at 50, of the capacitor terminals 41, 43 and the protective resin 46 encapsulating the capacitor element 42 and the solder coating-free portion 50 of the capacitor terminals 41, 43. The protective resin 46 is molded about the capacitor element 42 and the solder coating-free portion 50 of the terminals 43.

This first embodiment is ideal for a preferred surface mount configuration of solid aluminum capacitors having conductive polymer cathodes. The configuration includes a stack of etched and anodized aluminum foil coupons partially coated with conductive polymer, graphite, and conductive paint layers and with the cathode coatings bonded together and attached to a lead frame with conductive adhesive to form a negative terminal. The uncoated ends of the etched and anodized coupons are welded to each other and to a portion of a lead frame to form a positive terminal after encapsulation and singulation of the device.

As best shown in FIG. 2A, the capacitor element 42 is connected to the lead frame 24 by welding an anode stack, shown generally at 51, to an anode terminal 41 and adhering a cathode-coated anode coupon, shown generally at 53, to a cathode terminal 43 using silver loaded adhesive 55, for example. The welding is accomplished using resistance or laser welding. When applying the pre-coat resin 48 to the terminals 41, 43, the pre-coat resin 48 preferably does not extend beyond the portion of the terminals 41, 43 covered by the protective 46 in order to facilitate manipulation, or folding, of the terminals 41, 43 about the exterior of the protective resin. Additionally, the pre-coat resin 48 preferably does not extend over the portion of the terminals 41, 43 to be adhered to the cathode-coated anode coupon 53 or welded to the anode stack 51.

Figure 2B:
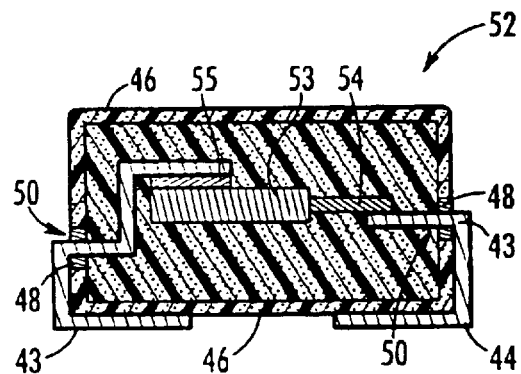
FIG. 2B is a cross-sectional view of a solid electrolytic capacitor in accordance with a second embodiment of the present invention.

FIG. 2B is a cross-sectional view of a solid electrolytic capacitor, shown generally at 52, in accordance with a second embodiment of the present invention. In this embodiment, the capacitor 52 includes a cathode-coated anode 53 connected to an anode riser wire 54. A portion of the lead frame 44 is connected to the anode riser wire 54 and another portion of the lead frame is connected to the cathode-coated anode body 53. The capacitor element is coated with a conductive silver paint 55. The pre-coat resin 48 covers the solder coating-free portion 50 of the capacitor terminals 43 where the protective resin 46 encapsulates the anode body 53 and the solder coating-free portion 50 of the capacitor terminals 43.

Figure 3:
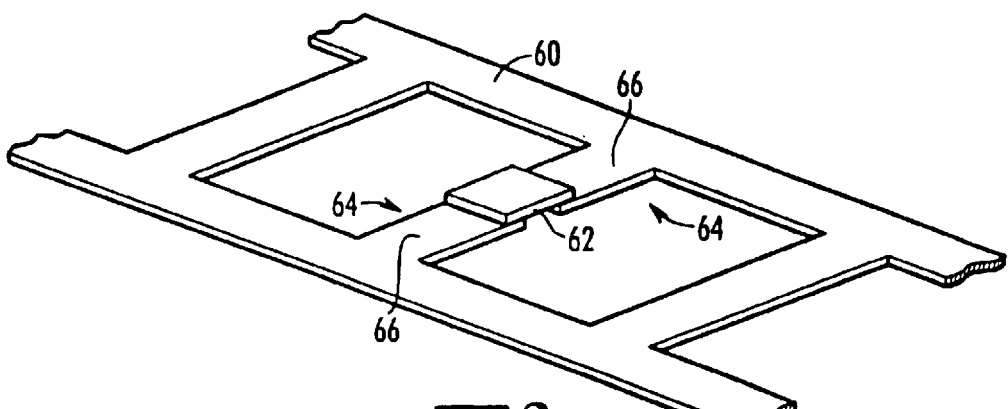
FIG. 3 is a perspective view of a lead frame with a capacitor element attached thereto in accordance with the present invention.

FIG. 3 is a perspective view of a lead frame 60 with a capacitor element 62 attached thereto in accordance with the present invention. As previously mentioned, the capacitor element 62 is attached to the lead frame 60 using conventional techniques. A resulting end-product capacitor has a portion 64 of the lead frame 60 serving as a capacitor terminal. The pre-coat resin is preferably applied to this portion 64 of the lead frame 60 prior to encapsulation of the capacitor element 62 and this portion 64 of the lead frame 60 by the protective resin. More preferably, the pre-coat resin is applied to the lead frame 60 prior to attaching the capacitor element 62 to the lead frame so that the pre-coat resin does not contact the capacitor element during application. Although not preferred, the pre-coat resin may be applied to the lead frame 60 after attachment to the capacitor element 62. Because the resin encapsulation of the capacitor covers a portion of the capacitor terminals 64, the pre-coat resin is most preferably applied only to this solder coating-free portion 66 of the capacitor terminals 64. The pre-coat resin prevents separation of the protective resin from the capacitor terminals.

Those of ordinary skill in the art will be aware of other variations that are within the scope of the claimed invention, which is to be measured by the following claims.

What is claimed is:

1. A solid electrolytic capacitor comprising:

a solid electrolytic capacitor element connected to surface mount terminals;

a pre-coat resin applied to at least a portion of said terminals; and a protective resin encapsulating said capacitor element and applied to a portion of said terminals over said pre-coat resin;

wherein said pre-coat resin is substantially rigid at ambient temperatures and flexible at elevated temperatures.

2. A solid electrolytic capacitor according to claim 1, wherein said pre-coat resin is a thermally curable epoxy resin.

3. A solid electrolytic capacitor according to claim 1, wherein said pre-coat resin comprises a lactone.

4. A solid electrolytic capacitor according to claim 3, wherein said lactone is butyrolactone.

* * * * *